(12) United States Patent
Feldman-Peabody (10) Patent No.: US 8,247,682 B2
(45) Date of Patent: Aug. 21, 2012

(54) METALLIC GRIDLINES AS FRONT CONTACTS OF A CADMIUM TELLURIDE BASED THIN FILM PHOTOVOLTAIC DEVICE

(75) Inventor: Scott Daniel Feldman-Peabody, Golden, CO (US)

(73) Assignee: PrimeStar Solar, Inc., Arvada, CO (US)

( * ) Notice: Subject to any disclaimer, the term of this patent is extended or adjusted under 35 U.S.C. 154(b) by 268 days.

(21) Appl. No.: 12/825,800

(22) Filed: Jun. 29, 2010

(65) Prior Publication Data

US 2011/0315185 A1  Dec. 29, 2011

(51) Int. Cl.
*H02N 6/00* (2006.01)
*H01L 31/042* (2006.01)
*H01L 31/00* (2006.01)

(52) U.S. Cl. ......... 136/249; 136/244; 136/256; 136/260

(58) Field of Classification Search .................. 136/244, 136/249, 256, 260
See application file for complete search history.

(56) References Cited

U.S. PATENT DOCUMENTS

| | | |
|---|---|---|
| 4,611,091 A | 9/1986 | Choudary et al. |
| 5,922,142 A | 7/1999 | Wu et al. |
| 6,137,048 A | 10/2000 | Wu et al. |
| 6,169,246 B1 | 1/2001 | Wu et al. |
| 6,221,495 B1 | 4/2001 | Wu et al. |
| 2005/0009228 A1 | 1/2005 | Wu et al. |
| 2008/0029152 A1* | 2/2008 | Milshtein et al. ............. 136/252 |
| 2008/0047599 A1* | 2/2008 | Buller et al. .................. 136/251 |
| 2009/0194155 A1 | 8/2009 | Den Boer et al. |
| 2009/0194157 A1 | 8/2009 | Den Boer et al. |
| 2009/0194165 A1 | 8/2009 | Murphy et al. |
| 2009/0272437 A1 | 11/2009 | Roberts et al. |

\* cited by examiner

*Primary Examiner* — Basia Ridley
*Assistant Examiner* — Allison Bourke
(74) *Attorney, Agent, or Firm* — Dority & Manning, P.A.

(57) ABSTRACT

Cadmium telluride based thin film photovoltaic devices are generally described. The device can include a transparent conductive oxide layer on a substrate. A plurality of metal gridlines can directly contact the transparent conductive oxide layer, and can be oriented in a first direction. A cadmium sulfide layer can be included on the transparent conductive oxide layer, and a cadmium telluride layer can be included on the cadmium sulfide layer. A plurality of scribe lines can be defined through the thickness of the cadmium sulfide layer and the cadmium telluride layer to define a plurality of photovoltaic cells such that the plurality of scribe lines are oriented in a second direction that intersects with the first direction.

18 Claims, 4 Drawing Sheets

METALLIC GRIDLINES AS FRONT CONTACTS OF A CADMIUM TELLURIDE BASED THIN FILM PHOTOVOLTAIC DEVICE

FIELD OF THE INVENTION

The subject matter disclosed herein relates generally to photovoltaic devices including metallic gridlines as front contacts and methods of making the same. More particularly, the subject matter disclosed herein relates to cadmium telluride thin film photovoltaic devices including metallic gridlines as front contacts in combination with a conductive transparent oxide film layer and methods of making the same.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. For example, CdTe has an energy bandgap of about 1.45 eV, which enables it to convert more energy from the solar spectrum as compared to lower bandgap semiconductor materials historically used in solar cell applications (e.g., about 1.1 eV for silicon). Also, CdTe converts radiation energy in lower or diffuse light conditions as compared to the lower bandgap materials and, thus, has a longer effective conversion time over the course of a day or in cloudy conditions as compared to other conventional materials. The junction of the n-type layer and the p-type layer is generally responsible for the generation of electric potential and electric current when the CdTe PV module is exposed to light energy, such as sunlight. Specifically, the cadmium telluride (CdTe) layer and the cadmium sulfide (CdS) form a p-n heterojunction, where the CdTe layer acts as a p-type layer (i.e., a positive, electron accepting layer) and the CdS layer acts as a n-type layer (i.e., a negative, electron donating layer).

A transparent conductive oxide ("TCO") layer is commonly used between the window glass and the junction forming layers. This TCO layer provides the front electrical contact on one side of the device and is used to collect and carry the electrical charge produced by the cell. While the TCO layer is typically produced from relatively low resistivity materials (e.g., cadmium stannate), the TCO layer still provides resistance to the series of cells in the device. This resistance in the TCO layer can inhibit the flow of electrons through the device, effectively hindering the efficiency of the photovoltaic device, especially cadmium telluride based photovoltaic devices. Increasing the thickness of the TCO layer can reduce the resistance of the front contact, but can also lead to increased material costs and a rough surface morphology that can adversely affect subsequently deposited layers of the device.

As such, a need exists to reduce the series resistance of the front electrical contact (e.g., the TCO layer) in photovoltaic devices, particularly cadmium telluride based photovoltaic devices, with minimal loss of current and without increasing the thickness of the TCO layer.

BRIEF DESCRIPTION OF THE INVENTION

Aspects and advantages of the invention will be set forth in part in the following description, or may be obvious from the description, or may be learned through practice of the invention.

Cadmium telluride based thin film photovoltaic devices are generally described. The device can include a transparent conductive oxide layer on a substrate. A plurality of metal gridlines can directly contact the transparent conductive oxide layer, and can be oriented in a first direction. A cadmium sulfide layer can be included on the transparent conductive oxide layer, and a cadmium telluride layer can be included on the cadmium sulfide layer. A plurality of scribe lines can be defined through the thickness of the cadmium sulfide layer and the cadmium telluride layer to define a plurality of photovoltaic cells such that the plurality of scribe lines are oriented in a second direction that intersects with the first direction.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWING

A full and enabling disclosure of the present invention, including the best mode thereof, directed to one of ordinary skill in the art, is set forth in the specification, which makes reference to the appended figures, in which.

Repeat use of reference characters in the present specification and drawings is intended to represent the same or analogous features or elements.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "µm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

A cadmium telluride based thin film photovoltaic device is generally provided having a plurality of metal gridlines directly contacting the transparent conductive oxide layer. Each of the metal gridlines is generally oriented in a direction that intersects with the direction of the scribe lines separating individual cells in the device. Thus, the plurality of metal gridlines can decrease the resistance of the transparent conductive oxide layer in the direction of the electrical current (i.e., from one cell to the adjacent cell separated by the scribe lines) to increase the efficiency of the device. Decreasing the resistance of the TCO layer, especially in the direction of the electrical current flow, can also allow for larger cells to be formed in the device, effectively increasing the active area of the device to lead to greater efficiencies.

FIGS. 1-6 each show a cadmium telluride based thin-film photovoltaic device 10 including metal gridlines 15 oriented in a direction that intersects with the direction of the scribe lines separating individual cells in the device and directly contacting the TCO layer 14. Although shown as generally perpendicular to the scribe lines 21, 23, and 26, the metal gridlines 15 can be oriented in any angle as long as each metal gridline 15 can traverse the individual cell to enhance the electrical conductivity of the TCO layer 14.

Figure 1:
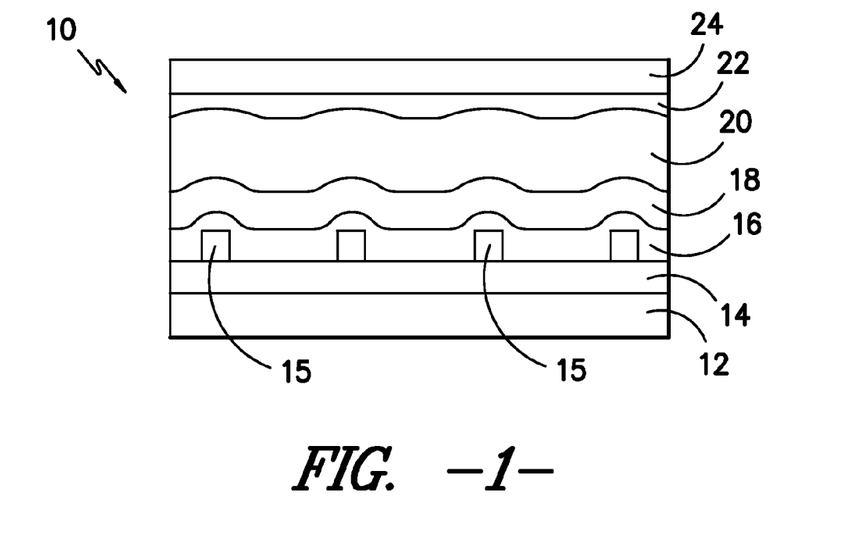
FIG. 1 shows a general schematic of a cross-sectional view of an exemplary cadmium telluride thin film photovoltaic device according to one embodiment of the present invention.
Figure 2:
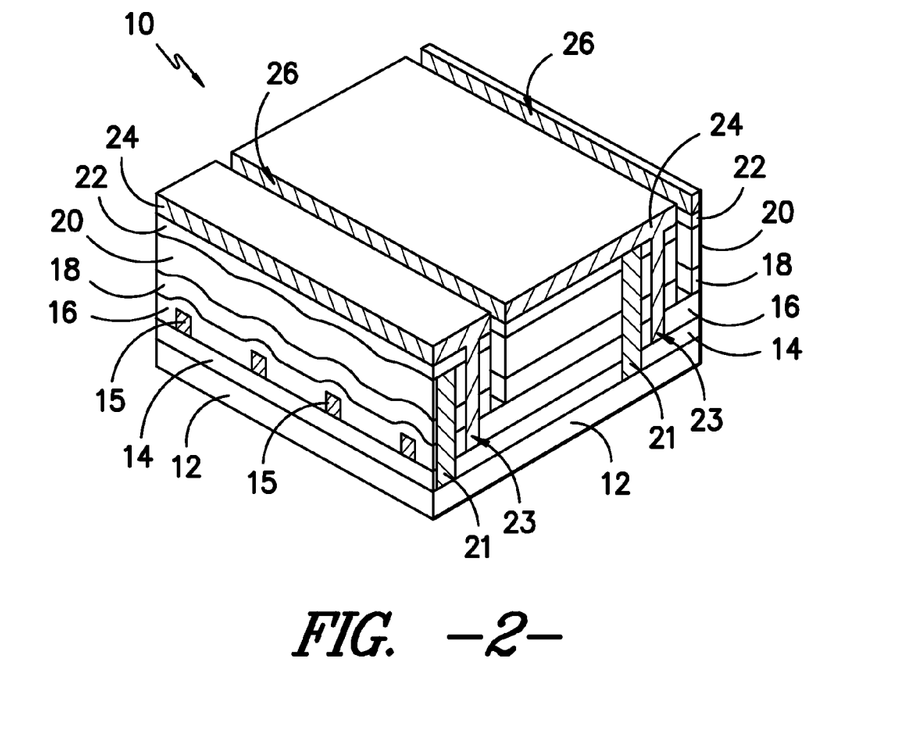
FIG. 2 shows a perspective view of the exemplary cadmium telluride thin film photovoltaic device of FIG. 1.
Figure 3:
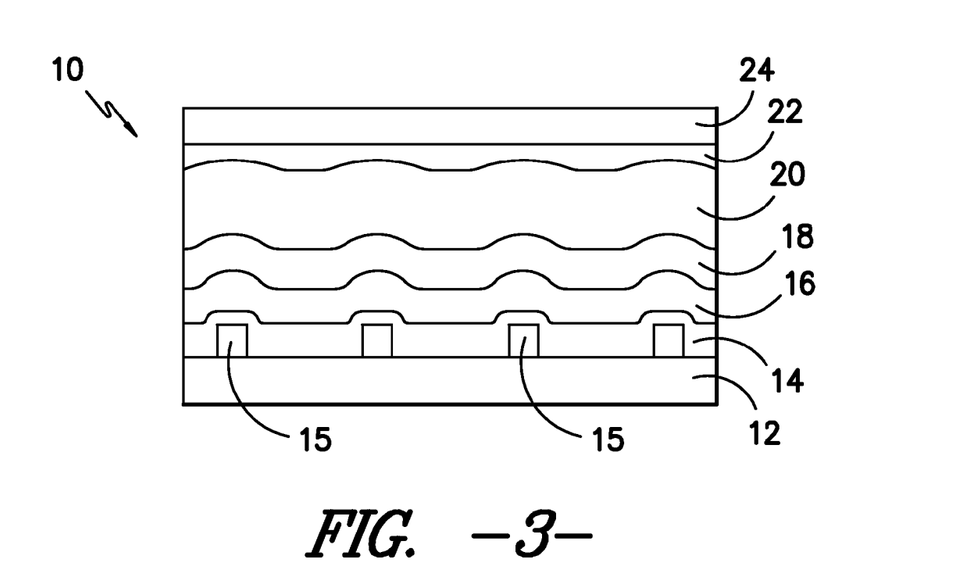
FIG. 3 shows a general schematic of a cross-sectional view of another exemplary cadmium telluride thin film photovoltaic device according to one embodiment of the present invention.
Figure 4:
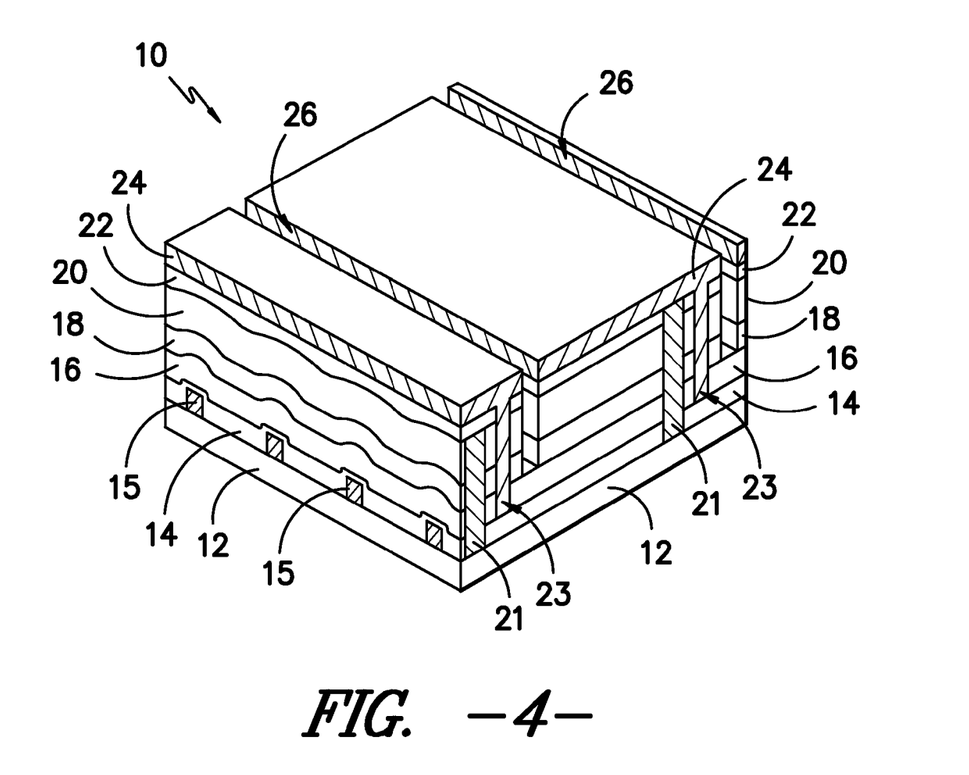
FIG. 4 shows a perspective view of the exemplary cadmium telluride thin film photovoltaic device of FIG. 3.
Figure 5:
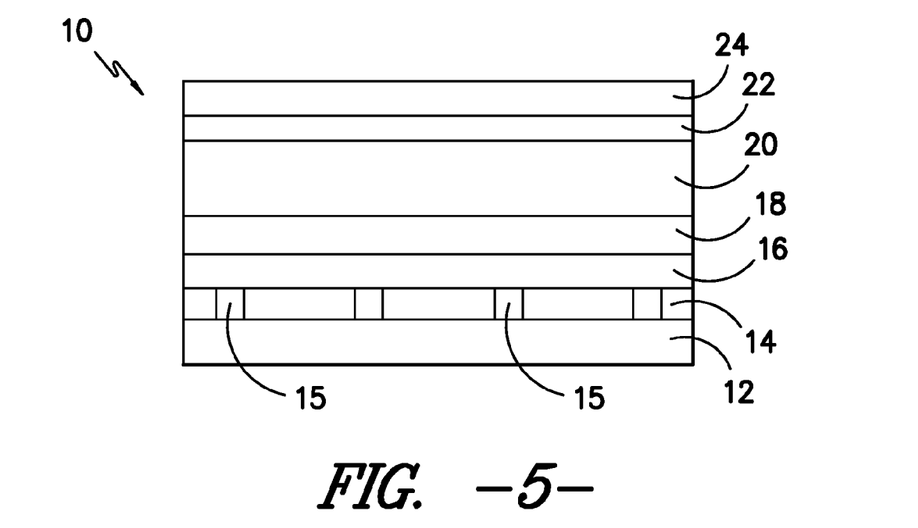
FIG. 5 shows a general schematic of a cross-sectional view of yet another exemplary cadmium telluride thin film photovoltaic device according to one embodiment of the present invention.
Figure 6:
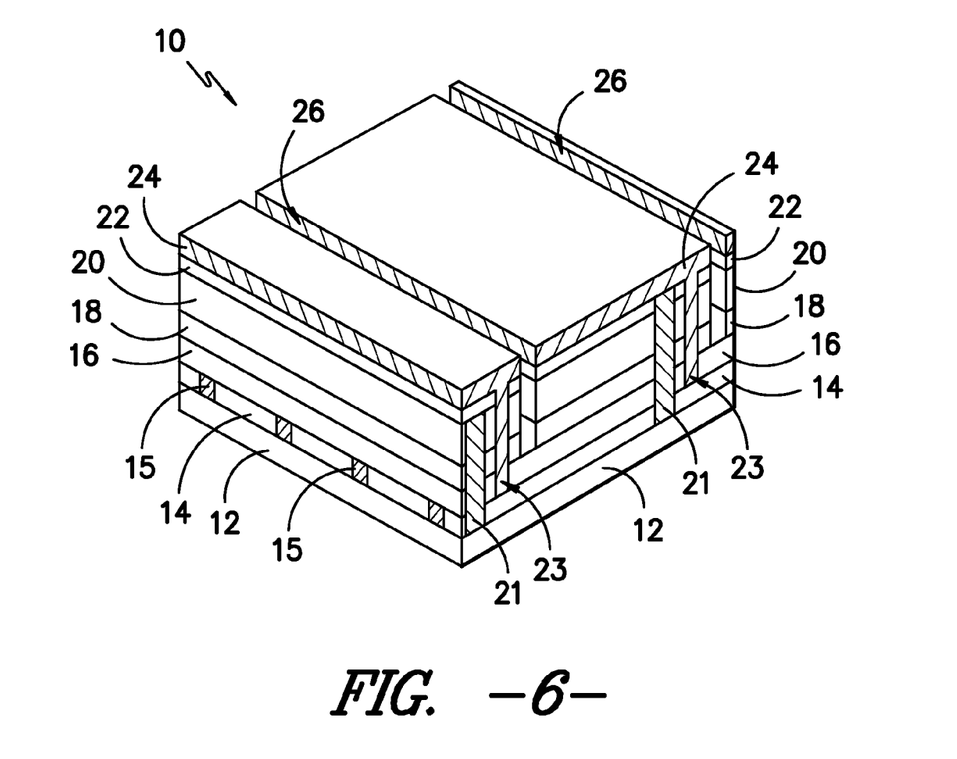
FIG. 6 shows a perspective view of the exemplary cadmium telluride thin film photovoltaic device of FIG. 5.

The metal gridlines 15 can be positioned adjacent to (i.e., either directly on or directly under) the transparent conductive oxide layer 14 in order to direct contacting the transparent conductive oxide layer 14. For example, FIGS. 1 and 2 show the metal gridlines 15 positioned between the transparent conductive oxide layer 14 and the resistive transparent buffer layer 16. On the other hand, FIGS. 3 and 4 show the metal gridlines 15 positioned between the transparent conductive oxide layer 14 and the glass substrate 12. Alternatively, the metal gridlines 15 can be positioned within the thickness of the transparent conductive oxide layer 14, as shown in FIGS. 5 and 6.

The metal gridlines can be generally constructed from a conductive metal or metal alloy. For instance, the metal gridlines can include tin, cadmium, nickel, chromium, gold, silver, platinum, copper, aluminum, palladium, or combinations or alloys thereof. Of course, any suitable conductive metallic material can be utilized to form the metal gridlines. Thus, the metal gridlines can serve to increase the electrical conductivity of the TCO layer and reduce the resistance of the TCO layer without increasing the thickness of the TCO layer.

Figure 7:
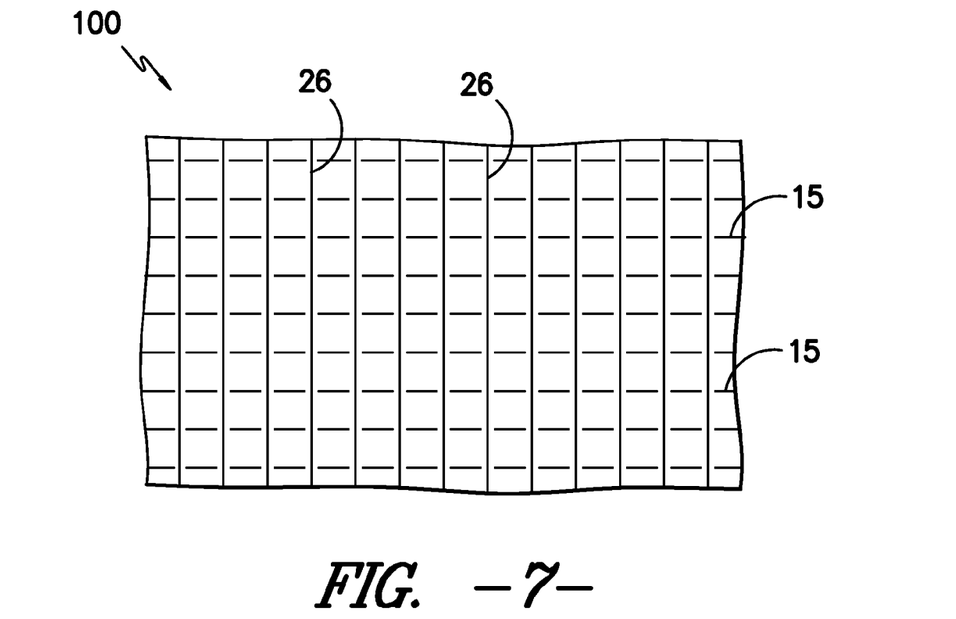
FIG. 7 shows a top view of an exemplary cadmium telluride thin film photovoltaic device according to any of FIGS. 1-6; and, FIG. 8 shows a general schematic of a cross-sectional view perpendicular to the views shown in FIGS. 1, 3, and 5 of the exemplary cadmium telluride thin film photovoltaic devices according to any of FIGS. 1, 3, and 5.

FIG. 7 shows a top view of one particular embodiment of an exemplary cadmium telluride based thin-film photovoltaic device where the metal gridlines 15 are substantially perpendicular to the scribe lines 26.

Regardless of the particular positioning of the metal gridlines 15 with respect to the TCO layer 14, the size and spacing of the metal gridlines 15 and the scribes 21, 23, 26 can be configured to maximize the efficiency of the photovoltaic device. Since the metal gridlines 15 are positioned adjacent to the TCO layer 14 and forms part of the window layers, the metal gridlines 15 will block a certain portion of light energy from reaching the underlying cadmium telluride layer 20. Thus, the spacing and size (e.g., width) of the metal gridlines 15 can be minimized to reduce the impact of such light blocking. For instance, in certain embodiments, the width of the metal gridlines 15 can be about 10 µm to about 250 µm, such as about 50 µm to about 150 µm. In one particular embodiment, the width of the metal gridlines 15 can be about 75 µm to about 125 µm, such as about 100 µm.

The thickness of the metal gridlines 15 can be relatively small to reduce the impact on subsequent layers. For example, the thickness of the metal gridlines 15 can be about 0.01 µm to about 1 µm, such as about 0.05 µm to about 0.5 µm. Thus, the subsequently deposited layers can remain substantially uniform in thickness over the TCO layer 14 and the metal gridlines 15. Nevertheless, FIGS. 1 and 3 each show that the thickness of the metal gridlines 15 causes the subsequently deposited layers (e.g., the RTB layer 16, the cadmium sulfide layer 18, and the cadmium telluride layer 20) to have a slightly non-flat surface. However, since the thickness of the metal gridlines 15 is relatively small compared to the spacing of the gridlines, the impact of the non-flat surface can be minimized after subsequent layers are deposited, greatly reducing any adverse effect that could be caused.

Figure 8:
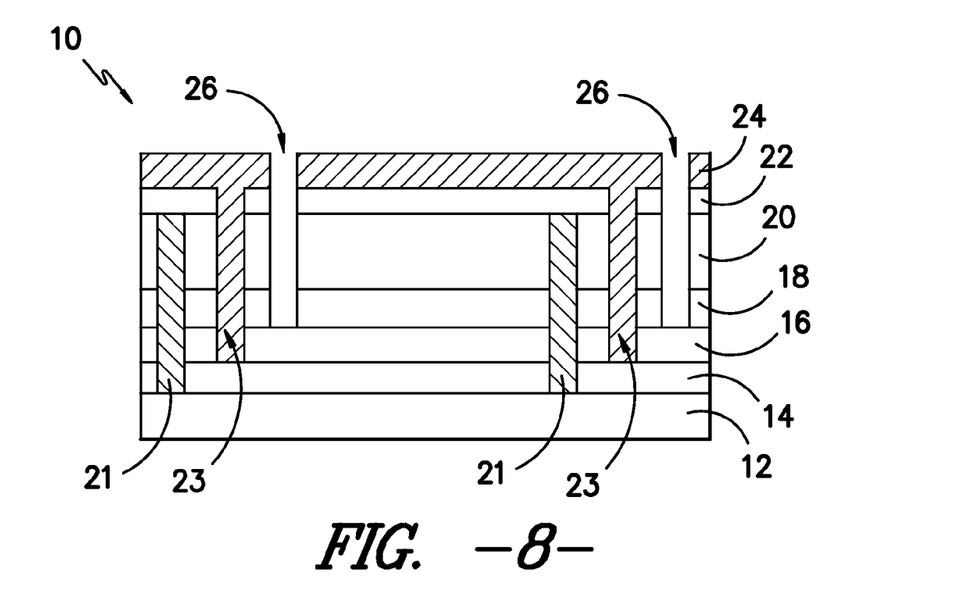

FIG. 8 shows a cross-section of an exemplary cadmium telluride based thin-film photovoltaic device 10. The device 10 is shown including a glass substrate 12, a TCO layer 14, a resistive transparent buffer layer 16, a cadmium sulfide layer 18, a cadmium telluride layer 20, a graphite layer 22, and a metal contact layer 24.

The photovoltaic device 10 generally includes a plurality of cells separated by scribe lines, generally formed via a laser scribing process. For example, the laser scribing process can entail defining a first isolation scribe through the photo reactive layers (i.e., the cadmium sulfide layer 18 and the cadmium telluride layer 20) and underlying layers (i.e., through the TCO layer 14) down to the glass substrate 12. The first isolation scribe line 21 is then filled with dielectric material before application of the back contact layers in order to ensure that the TCO layer 14 is electrically isolated between cells. For example, the first isolation scribe 21 can be filled using a photoresist development process wherein a liquid negative photoresist (NPR) material is coated onto the cadmium telluride layer 20 by spraying, roll coating, screen printing, or any other suitable application process. The substrate 12 is then exposed to light from below such that the NPR material in the first isolation scribes 21 (and any pinholes in the cadmium telluride material 20) are exposed to the light, causing the exposed NPR polymers to crosslink and "harden." The substrate 12 is then "developed" in a process wherein a chemical developer is applied to the cadmium telluride layer 20 to dissolve any unhardened NPR material. In other words, the NPR material that was not exposed to the light is washed away from the cadmium telluride layer 20 by the developer, leaving the first isolation scribes 21 filled with the NPR material.

A series connecting scribe 23 can be laser cut through the graphite layer 22 to the TCO layer 14 and filled with the conductive metallic material of the metal contact layer 24 to electrically connect adjacent cells to each other in series. Of course, any conductive material can be included in the series connecting scribes 23. Specifically, the series connecting scribe 23 can allow the metal contact layer 24 to contact the TCO layer 14 providing a direct electrical connection between the back contact (i.e., the graphite layer 22 and the metal contact layer 24) and the front contact material (i.e., the TCO layer 14 and the metal gridlines 15).

Finally, a second isolation scribe 26 can be laser cut through the back contact (i.e., the graphite layer 22 and the metal contact layer 24) and photo reactive layers (i.e., the cadmium sulfide layer 18 and the cadmium telluride layer 20) to isolate the back contact into individual cells.

As stated, the metal gridlines 15 can be used in any cadmium telluride thin film photovoltaic device 10. The exemplary device 10 of FIGS. 1-6 and 8 includes a top sheet of glass 12 employed as the substrate. In this embodiment, the glass 12 can be referred to as a "superstrate," since it is the substrate on which the subsequent layers are formed, but it faces upwards to the radiation source (e.g., the sun) when the cadmium telluride thin film photovoltaic device 10 is in used. The top sheet of glass 12 can be a high-transmission glass (e.g., high transmission borosilicate glass), low-iron float glass, or other highly transparent glass material. The glass is generally thick enough to provide support for the subsequent film layers (e.g., from about 0.5 mm to about 10 mm thick), and is substantially flat to provide a good surface for forming the subsequent film layers. In one embodiment, the glass 12 can be a low iron float glass containing less than about 0.15% by weight iron (Fe), and may have a transmissiveness of about 0.9 or greater in the spectrum of interest (e.g., wavelengths from about 300 nm to about 900 nm).

The transparent conductive oxide (TCO) layer 14 is shown on the glass 12 of the exemplary device 10. The TCO layer 14 allows light to pass through with minimal absorption while also allowing electric current produced by the device 10 to travel sideways to opaque metal conductors (not shown). For instance, the TCO layer 14 can have a sheet resistance less than about 30 ohm per square, such as from about 4 ohm per square to about 20 ohm per square (e.g., from about 8 ohm per square to about 15 ohm per square). The TCO layer 14 generally includes at least one conductive oxide, such as tin oxide, zinc oxide, or indium tin oxide, or mixtures thereof. Additionally, the TCO layer 14 can include other conductive, transparent materials. The TCO layer 14 can also include zinc stannate and/or cadmium stannate.

The TCO layer 14 can be formed by sputtering, chemical vapor deposition, spray pyrolysis, or any other suitable deposition method. In one particular embodiment, the TCO layer 14 can be formed by sputtering, either DC sputtering or RF sputtering, on the glass 12. For example, a cadmium stannate layer can be formed by sputtering a hot-pressed target containing stoichiometric amounts of $SnO_2$ and CdO onto the glass 12 in a ratio of about 1 to about 2. The cadmium stannate can alternatively be prepared by using cadmium acetate and tin (II) chloride precursors by spray pyrolysis.

In certain embodiments, the TCO layer 14 can have a thickness between about 0.1 μm and about 1 μm, for example from about 0.1 μm to about 0.5 μm, such as from about 0.25 μm to about 0.35 μm. Suitable flat glass substrates having a TCO layer 14 formed on the superstrate surface can be purchased commercially from various glass manufactures and suppliers. For example, a particularly suitable glass 12 including a TCO layer 14 includes a glass commercially available under the name TEC 15 TCO from Pilkington North America Inc. (Toledo, Ohio), which includes a TCO layer having a sheet resistance of 15 ohms per square. The metal gridlines 15 can be added onto the TCO layer 14 of such a commercial product, as shown in FIGS. 1 and 2.

The resistive transparent buffer layer 16 (RTB layer) is shown on the TCO layer 14 on the exemplary cadmium telluride thin film photovoltaic device 10. The RTB layer 16 is generally more resistive than the TCO layer 14 and can help protect the device 10 from chemical interactions between the TCO layer 14 and the subsequent layers during processing of the device 10. For example, in certain embodiments, the RTB layer 16 can have a sheet resistance that is greater than about 1000 ohms per square, such as from about 10 kOhms per square to about 1000 MOhms per square. The RTB layer 16 can also have a wide optical bandgap (e.g., greater than about 2.5 eV, such as from about 2.7 eV to about 3.0 eV).

Without wishing to be bound by a particular theory, it is believed that the presence of the RTB layer 16 between the TCO layer 14 and the cadmium sulfide layer 18 can allow for a relatively thin cadmium sulfide layer 18 to be included in the device 10 by reducing the possibility of interface defects (i.e., "pinholes" in the cadmium sulfide layer 18) creating shunts between the TCO layer 14 and the cadmium telluride layer 22. Thus, it is believed that the RTB layer 16 allows for improved adhesion and/or interaction between the TCO layer 14 and the cadmium telluride layer 22, thereby allowing a relatively thin cadmium sulfide layer 18 to be formed thereon without significant adverse effects that would otherwise result from such a relatively thin cadmium sulfide layer 18 formed directly on the TCO layer 14.

The RTB layer 16 can include, for instance, a combination of zinc oxide (ZnO) and tin oxide ($SnO_2$), which can be referred to as a zinc tin oxide layer ("ZTO"). In one particular embodiment, the RTB layer 16 can include more tin oxide than zinc oxide. For example, the RTB layer 16 can have a composition with a stoichiometric ratio of $ZnO/SnO_2$ between about 0.25 and about 3, such as in about an one to two (1:2) stoichiometric ratio of tin oxide to zinc oxide. The RTB layer 16 can be formed by sputtering, chemical vapor deposition, spraying pryolysis, or any other suitable deposition method. In one particular embodiment, the RTB layer 16 can be formed by sputtering, either DC sputtering or RF sputtering, on the TCO layer 14. For example, the RTB layer 16 can be deposited using a DC sputtering method by applying a DC current to a metallic source material (e.g., elemental zinc, elemental tin, or a mixture thereof) and sputtering the metallic source material onto the TCO layer 14 in the presence of an oxidizing atmosphere (e.g., $O_2$ gas). When the oxidizing atmosphere includes oxygen gas (i.e., $O_2$), the atmosphere can be greater than about 95% pure oxygen, such as greater than about 99%.

In certain embodiments, the RTB layer 16 can have a thickness between about 0.075 μm and about 1 μm, for example from about 0.1 μm to about 0.5 μm. In particular embodiments, the RTB layer 16 can have a thickness between about 0.08 μm and about 0.2 μm, for example from about 0.1 μm to about 0.15 μm.

The cadmium sulfide layer 18 is shown on resistive transparent buffer layer 16 of the exemplary device 10. The cadmium sulfide layer 18 is a n-type layer that generally includes cadmium sulfide (CdS) but may also include other materials, such as zinc sulfide, cadmium zinc sulfide, etc., and mixtures thereof as well as dopants and other impurities. In one particular embodiment, the cadmium sulfide layer may include oxygen up to about 25% by atomic percentage, for example from about 5% to about 20% by atomic percentage. The cadmium sulfide layer 18 can have a wide band gap (e.g., from about 2.25 eV to about 2.5 eV, such as about 2.4 eV) in order to allow most radiation energy (e.g., solar radiation) to pass. As such, the cadmium sulfide layer 18 is considered a transparent layer on the device 10.

The cadmium sulfide layer 18 can be formed by sputtering, chemical vapor deposition, chemical bath deposition, and other suitable deposition methods. In one particular embodiment, the cadmium sulfide layer 18 can be formed by sputtering, either direct current (DC) sputtering or radio frequency (RF) sputtering, on the resistive transparent layer 16. Sputtering deposition generally involves ejecting material from a target, which is the material source, and depositing the ejected material onto the substrate to form the film. DC sputtering generally involves applying a voltage to a metal target (i.e., the cathode) positioned near the substrate (i.e., the anode) within a sputtering chamber to form a direct-current discharge. The sputtering chamber can have a reactive atmosphere (e.g., an oxygen atmosphere, nitrogen atmosphere, fluorine atmosphere) that forms a plasma field between the metal target and the substrate. The pressure of the reactive atmosphere can be between about 1 mTorr and about 20 mTorr for magnetron sputtering. When metal atoms are released from the target upon application of the voltage, the metal atoms can react with the plasma and deposit onto the surface of the substrate. For example, when the atmosphere contains oxygen, the metal atoms released from the metal target can form a metallic oxide layer on the substrate. Conversely, RF sputtering generally involves exciting a capacitive discharge by applying an alternating-current (AC) or radio-frequency (RF) signal between the target (e.g., a ceramic source material) and the substrate. The sputtering chamber can have an inert atmosphere (e.g., an argon atmosphere) having a pressure between about 1 mTorr and about 20 mTorr.

Due to the presence of the resistive transparent layer 16, the cadmium sulfide layer 18 can have a thickness that is less than about 0.1 μm, such as between about 10 nm and about 100 nm, such as from about 50 nm to about 80 nm, with a minimal presence of pinholes between the resistive transparent layer 16 and the cadmium sulfide layer 18. Additionally, a cadmium sulfide layer 18 having a thickness less than about 0.1 μm reduces any adsorption of radiation energy by the cadmium sulfide layer 18, effectively increasing the amount of radiation energy reaching the underlying cadmium telluride layer 22.

The cadmium telluride layer 20 is shown on the cadmium sulfide layer 18 in the exemplary cadmium telluride thin film photovoltaic device 10 of FIG. 1. The cadmium telluride layer 20 is a p-type layer that generally includes cadmium telluride (CdTe) but may also include other materials. As the p-type layer of device 10, the cadmium telluride layer 20 is the photovoltaic layer that interacts with the cadmium sulfide layer 18 (i.e., the n-type layer) to produce current from the adsorption of radiation energy by absorbing the majority of the radiation energy passing into the device 10 due to its high absorption coefficient and creating electron-hole pairs. For example, the cadmium telluride layer 20 can generally be formed from cadmium telluride and can have a bandgap tailored to absorb radiation energy (e.g., from about 1.4 eV to about 1.5 eV, such as about 1.45 eV) to create the maximum number of electron-hole pairs with the highest electrical potential (voltage) upon absorption of the radiation energy. Electrons may travel from the p-type side (i.e., the cadmium telluride layer 20) across the junction to the n-type side (i.e., the cadmium sulfide layer 18) and, conversely, holes may pass from the n-type side to the p-type side. Thus, the p-n junction formed between the cadmium sulfide layer 18 and the cadmium telluride layer 20 forms a diode in which the charge imbalance leads to the creation of an electric field spanning the p-n junction. Conventional current is allowed to flow in only one direction and separates the light induced electron-hole pairs.

The cadmium telluride layer 20 can be formed by any known process, such as vapor transport deposition, chemical vapor deposition (CVD), spray pyrolysis, electro-deposition, sputtering, close-space sublimation (CSS), etc. In one particular embodiment, the cadmium sulfide layer 18 is deposited by a sputtering and the cadmium telluride layer 20 is deposited by close-space sublimation. In particular embodiments, the cadmium telluride layer 20 can have a thickness between about 0.1 μm and about 10 μm, such as from about 1 μm and about 5 μm. In one particular embodiment, the cadmium telluride layer 20 can have a thickness between about 2 μm and about 4 such as about 3 μm.

A series of post-forming treatments can be applied to the exposed surface of the cadmium telluride layer 20. These treatments can tailor the functionality of the cadmium telluride layer 20 and prepare its surface for subsequent adhesion to the back contact layers 22 and 24. For example, the cadmium telluride layer 20 can be annealed at elevated temperatures (e.g., from about 350° C. to about 500° C., such as from about 375° C. to about 424° C.) for a sufficient time (e.g., from about 1 to about 10 minutes) to create a quality p-type layer of cadmium telluride. Without wishing to be bound by theory, it is believed that annealing the cadmium telluride layer 20 (and the device 10) converts the normally n-type cadmium telluride layer 20 to a p-type cadmium telluride layer 20 having a relatively low resistivity. Additionally, the cadmium telluride layer 20 can recrystallize and undergo grain growth during annealing.

Annealing the cadmium telluride layer 20 can be carried out in the presence of cadmium chloride in order to dope the cadmium telluride layer 20 with chloride ions. For example, the cadmium telluride layer 20 can be washed with an aqueous solution containing cadmium chloride then annealed at the elevated temperature.

In one particular embodiment, after annealing the cadmium telluride layer 20 in the presence of cadmium chloride, the surface can be washed to remove any cadmium oxide formed on the surface. This surface preparation can leave a Te-rich surface on the cadmium telluride layer 20 by removing oxides from the surface, such as CdO, $CdTeO_3$, $CdTe_2O_5$, etc. For instance, the surface can be washed with a suitable solvent (e.g., ethylenediamine also known as 1,2 diaminoethane or "DAE") to remove any cadmium oxide from the surface.

Additionally, copper can be added to the cadmium telluride layer 20. Along with a suitable etch, the addition of copper to the cadmium telluride layer 20 can form a surface of copper-telluride on the cadmium telluride layer 20 in order to obtain a low-resistance electrical contact between the cadmium telluride layer 20 (i.e., the p-type layer) and the back contact layer(s). Specifically, the addition of copper can create a surface layer of cuprous telluride ($Cu_2Te$) between the cadmium telluride layer 20 and the back contact layer 22. Thus, the Te-rich surface of the cadmium telluride layer 20 can enhance the collection of current created by the device through lower resistivity between the cadmium telluride layer 20 and the back contact layer 22.

Copper can be applied to the exposed surface of the cadmium telluride layer 20 by any process. For example, copper can be sprayed or washed on the surface of the cadmium telluride layer 20 in a solution with a suitable solvent (e.g., methanol, water, or the like, or combinations thereof) followed by annealing. In particular embodiments, the copper may be supplied in the solution in the form of copper chloride, copper iodide, or copper acetate. The annealing temperature is sufficient to allow diffusion of the copper ions into the cadmium telluride layer 20, such as from about 125° C. to about 300° C. (e.g. from about 150° C. to about 200° C.) for about 5 minutes to about 30 minutes, such as from about 10 to about 25 minutes.

The back contact is formed from the graphite layer 22 and the metal contact layer 22 shown on the cadmium telluride layer 20 and generally serves as the back electrical contact, in relation to the opposite, TCO layer 14 serving as the front electrical contact. The back contact is formed on, and in one embodiment is in direct contact with, the cadmium telluride layer 20.

The graphite layer 22 can include a polymer blend or a carbon paste and can be applied to the semiconductor device by any suitable method for spreading the blend or paste, such as screen printing, spraying or by a "doctor" blade. After the application of the graphite blend or carbon paste, the device 10 can be heated to convert the blend or paste into the conductive graphite layer 22. The graphite layer 22 can be, in particular embodiments, from about 0.1 μm to about 10 μm in thickness, for example from about 1 μm to about 5 μm.

The metal contact layer 24 is suitably made from one or more highly conductive materials, such as elemental nickel, chromium, copper, tin, aluminum, gold, silver, technetium or alloys or mixtures thereof. The metal contact layer 24, if made of or comprising one or more metals, is suitably applied by a technique such as sputtering or metal evaporation. The metal contact layer 24 can be from about 0.1 μm to about 1.5 μm in thickness.

Other components (not shown) can be included in the exemplary device 10, such as buss bars, external wiring, laser etches, etc. For example, when the device 10 forms a photovoltaic cell of a photovoltaic module, a plurality of photovoltaic cells can be connected in series in order to achieve a desired voltage, such as through an electrical wiring connection. Each end of the series connected cells can be attached to a suitable conductor such as a wire or bus bar, to direct the photovoltaically generated current to convenient locations for connection to a device or other system using the generated electric. A convenient means for achieving such series connections is to laser scribe the device to divide the device into a series of cells connected by interconnects. In one particular embodiment, for instance, a laser can be used to scribe the deposited layers of the semiconductor device to divide the device into a plurality of series connected cells, as described above with respect to FIG. 8.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A cadmium telluride based thin film photovoltaic device, comprising:
    a substrate;
    a transparent conductive oxide layer on the substrate;
    a plurality of metal gridlines directly contacting the transparent conductive oxide layer, wherein the plurality of metal gridlines are oriented in a first direction;
    a cadmium sulfide layer on the transparent conductive oxide layer; and,
    a cadmium telluride layer on the cadmium sulfide layer;
    wherein a plurality of scribe lines are defined through the thickness of the cadmium sulfide layer and the cadmium telluride layer to define a plurality of photovoltaic cells such that the plurality of scribe lines are oriented in a second direction that intersects with the first direction, and wherein the plurality of scribe lines comprises a first isolation scribe isolating the transparent conductive oxide layer into individual photovoltaic cells, a series connecting scribe electrically connecting adjacent individual photovoltaic cells to each other in series, and a second isolation scribe to isolate a back contact into individual photovoltaic cells, the first isolation scribe traversing the transparent conductive oxide layer and the metal gridlines, the cadmium sulfide layer, and the cadmium telluride layer.

2. The device of claim 1, wherein the first direction is substantially perpendicular to the second direction.

3. The device of claim 1, wherein the metal gridlines comprise tin, cadmium, nickel, chromium, gold, silver, platinum, copper, aluminum, palladium, or combinations or alloys thereof.

4. The device of claim 1, wherein the metal gridlines are between the substrate and the transparent conductive oxide layer.

5. The device of claim 1, wherein the metal gridlines are within the thickness of the transparent conductive oxide layer.

6. The device of claim 1, wherein the metal gridlines are on the transparent conductive oxide layer to be positioned between the transparent conductive oxide layer and the cadmium sulfide layer.

7. The device of claim 1, wherein the metal gridlines have an average width of about 50 μm to about 250 μm.

8. The device of claim 1, where the metal gridlines have an average width of about 75 μm to about 125 μm.

9. The device of claim 1, wherein the metal gridlines have a thickness of less than about 1 μm.

10. The device of claim 1, wherein the metal gridlines have a thickness of about 0.1 μm to about 0.5 μm.

11. The device of claim 1, further comprising:
    a resistive transparent buffer layer between the transparent conductive oxide layer and the cadmium sulfide layer.

12. The device of claim 11, wherein the metal gridlines are positioned between the transparent conductive oxide layer and the resistive transparent buffer layer.

13. The device of claim 1, wherein the back contact layer comprises:
    a graphite layer on the cadmium telluride layer; and,
    a metal contact layer on the graphite layer.

14. The device of claim 1, wherein the first isolation scribe comprises a photoresist material.

15. The device of claim 1, wherein the series connecting scribe comprises a conductive metallic material to electrically connect adjacent photovoltaic cells to each other in series.

16. The device of claim 13, wherein the series connecting scribe traverses cadmium sulfide layer, the cadmium telluride layer, and the graphite layer.

17. The device of claim 13, wherein the second isolation scribe traverses the metal contact layer, the graphite layer, the cadmium telluride layer, and the cadmium sulfide layer.

18. A cadmium telluride based thin film photovoltaic device, comprising:
   a glass substrate;
   a transparent conductive oxide layer on the substrate;
   a plurality of metal gridlines directly on the transparent conductive oxide layer, wherein the plurality of metal gridlines are oriented in a first direction;
   a resistive transparent buffer layer on the transparent conductive oxide layer and the plurality of metal gridlines;
   a cadmium sulfide layer on the resistive transparent buffer layer; and,
   a cadmium telluride layer on the cadmium sulfide layer;
   wherein a plurality of scribe lines are defined through the thickness of the cadmium sulfide layer and the cadmium telluride layer to define a plurality of photovoltaic cells such that the plurality of scribe lines are oriented in a second direction that intersects with the first direction, and wherein the plurality of scribe lines comprises a first isolation scribe isolating the transparent conductive oxide layer into individual photovoltaic cells, a series connecting scribe electrically connecting adjacent individual photovoltaic cells to each other in series, and a second isolation scribe to isolate a back contact into individual photovoltaic cells, the first isolation scribe traversing the transparent conductive oxide layer and the metal gridlines, the resistive transparent buffer layer, the cadmium sulfide layer, and the cadmium telluride layer.

* * * * *